(12) United States Patent
Hasegawa et al.

(10) Patent No.: US 8,610,294 B2
(45) Date of Patent: Dec. 17, 2013

(54) LASER PROCESSING METHOD AND SEMICONDUCTOR DEVICE OBTAINED BY USING THE PROCESSING METHOD

(75) Inventors: Yutaka Hasegawa, Hanyu (JP); Masaaki Shiraishi, Satte (JP)

(73) Assignee: On Semiconductor Trading, Ltd., Hamilton (BM)

( * ) Notice: Subject to any disclaimer, the term of this patent is extended or adjusted under 35 U.S.C. 154(b) by 138 days.

(21) Appl. No.: 13/187,883

(22) Filed: Jul. 21, 2011

(65) Prior Publication Data

US 2012/0018850 A1      Jan. 26, 2012

(30) Foreign Application Priority Data

Jul. 23, 2010   (JP) ................................. 2010-165809

(51) Int. Cl.
   *H01L 23/544*   (2006.01)

(52) U.S. Cl.
   USPC ............. 257/797; 257/E23.179; 438/795; 438/940; 347/233

(58) Field of Classification Search
   USPC ............ 438/795, 940; 257/E23.179, 797; 347/233
   See application file for complete search history.

(56) References Cited

U.S. PATENT DOCUMENTS

| | | | | |
|---|---|---|---|---|
| 6,958,762 | B2 * | 10/2005 | Franklin | 347/225 |
| 7,355,614 | B2 * | 4/2008 | Franklin | 347/225 |
| 2012/0018850 | A1 * | 1/2012 | Hasegawa et al. | 257/618 |

FOREIGN PATENT DOCUMENTS

| | | |
|---|---|---|
| JP | 05-162441 | 6/1993 |
| JP | 09-220686 | 8/1997 |

* cited by examiner

*Primary Examiner* — George Fourson, III
(74) *Attorney, Agent, or Firm* — McDermott Will & Emery LLP

(57) ABSTRACT

A conventional laser processing method has a problem that the number of scanning lines is large, and it is difficult to shorten the time needed for the marking. In a laser processing method of the present invention, a first laser processing is performed in accordance with the outer border of, for example, an English letter "A," and thereafter, second and subsequent laser processings are performed on an inner region inside the outer border. In this event, for the second and subsequent laser processings, the respective processing lines (scanning lines) are set up in a longitudinal direction of a processing region. Thus, the number of processing lines is greatly reduced. As a result, the time needed for the marking is greatly shortened, and the laser marking workability is improved.

10 Claims, 6 Drawing Sheets

LASER PROCESSING METHOD AND SEMICONDUCTOR DEVICE OBTAINED BY USING THE PROCESSING METHOD

This application claims priority from Japanese Patent Application Number JP 2010-165809 filed on Jul. 23, 2010, the content of which is incorporated herein by reference in its entirety.

BACKGROUND OF THE INVENTION

1. Field of the Invention

The present invention relates to a laser processing method for marking, or performing similar processing on, a surface of a processing target by radiating a laser beam on the processing target, and a semiconductor device obtained by using the processing method.

2. Description of the Related Art

As examples of a conventional marking method using a laser beam, the following laser processing methods have been known.

Description will be given of how, for example, an English letter "A" is marked as shown in FIG. 6A. An information converting unit of a marking machine performs arithmetic on various data inputted into a marking information input unit, and converts the data into marking data. Specifically, marking data (surface data), which is denoted by reference numeral 41, is converted into multiple small pieces of horizontal data (scanning data in a lateral direction of the drawing) as denoted by reference numeral 42.

FIG. 6B shows some pieces of the horizontal data (scanning data in the lateral direction of the drawing). Each of the pieces of the horizontal data (scanning data in the lateral direction of the drawing), which are denoted by reference numerals 43 to 46, indicates that, for example, a laser beam should be turned off in white regions and turned on in black regions. In addition, the marking machine controls a laser beam source unit and so forth, and hence performs laser processing based on all the pieces of the horizontal data (scanning data in the lateral direction of the drawing) from an uppermost portion of FIG. 6A to a lowermost portion thereof. Thus, the English letter "A" is marked on the surface of the processing target. This technology is described, for instance, in Japanese Patent Application Publication No. Hei 5-162441 (pages 2-3, FIGS. 1 and 3).

Moreover, there is a known method for marking, by using a laser, a surface of a package made of a plastic, ceramic, resin or the like, and including semiconductor integrated circuits. This technology is described, for instance, in Japanese Patent Application Publication No. Hei 9-220686 (pages 2-4, FIGS. 1 and 7).

As described above, in the conventional laser processing methods, for example, the English letter "A" is marked by combining multiple pieces of the horizontal data (scanning data in the lateral direction of the drawing). Accordingly, the number of pieces of the horizontal data is large. Particularly, marked letters and the like such as marked English letters and marked figures are usually designed vertically long. For this reason, the conventional laser processing methods inevitably handle a large number of pieces of horizontal data, as well as bring about a problem of difficulty in shortening time needed for the marking, and a problem of poor workability of laser marking.

In addition, the conventional laser processing is performed from a left end portion toward a right end portion of each of pieces of horizontal data (scanning data in the lateral direction of the drawing). After a laser processing is ended based on one piece of the horizontal data, another laser processing is similarly performed on the next piece of the horizontal data positioned below from a left end portion toward a right end portion thereof. In other words, in the conventional laser processing methods, the laser beam source unit moves a long distance during a non-marking period between each two adjacent pieces of the horizontal data. Such a laser processing method also has the problem of difficulty in shortening time needed for the marking.

Moreover, as shown in FIG. 6B, each of the pieces of the horizontal data (scanning data in the lateral direction of the drawing), which are denoted by reference numerals 43 to 46, indicates that a laser beam should be turned on in the black regions and turned off in the white regions. As illustrated, in an "inverted V" portion of the English letter "A," most of each piece of the horizontal data represents the white regions, implying that the non-marking period is long. Such a laser processing method also has the problem of difficulty in shortening time needed for the marking.

FIG. 6C shows how a laser processing is performed on a region indicated by a circle 47 in FIG. 6A. As described above, the English letter "A" is marked by the combination of the laser processings based on the multiple pieces of the horizontal data (scanning data in the lateral direction of the drawing). Accordingly, in the "inverted V" portion of the English letter "A," as shown in FIG. 6B, the starting position of the laser processing is shifted outwardly stepwise. Thus, the English letter "A" is laser-processed in a way that the border of the letter A is shaped like steps. The English letter "A" not having a smoothly-shaped border brings about a problem of poor visibility. Further, when the marked letter or the like is used for pattern recognition, the border shape may deteriorate the letter recognition accuracy in some cases. Particularly, when the border of a letter to be marked has a curved line, there is a problem that it is difficult to form the curved line in a smooth shape.

Packages including semiconductor integrated circuits are mounted in portable electronic devices such as cellular phones or digital cameras. Recently, as the portable electronic devices and the like become thinner, the very packages to be mounted there are demanded to be thinner. Accordingly, there is no room left in the thickness of such packages. If the package surfaces are laser-processed too deeply, a problem occurs in which thin metal wires may be exposed to the outside from the marked area or may be seen through the package surfaces, and consequently the packages are treated as defective products.

Furthermore, since a company logo, product number and the like are marked on the package surface, letters and the like to be marked are designed using several line widths. Thus, a unicursal approach using a laser beam of one fixed width does not enable the aforementioned company logo, product number or the like to be marked by a single laser processing. For this reason, the laser processing has to be performed several times to mark the aforementioned company logo, product number and the like. In this event, if laser processing lines intersect each other, the package surface is processed too deeply in the intersection region, resulting in the aforementioned problem of a package defect.

SUMMARY OF THE INVENTION

The present invention has been made in view of the above-described circumstances. A laser processing method of the present invention is marks a processing target with a letter or a figure. The letter or the figure is characterized by a processing region having an outer border. Multiple processing lines are set in the processing region of the letter or figure to be marked, and a laser beam is delivered to the processing target to mark the processing target along each of the processing lines. A first processing line is set along the outer border of the processing region, and each subsequent processing line is set along a longitudinal direction of the processing region.

DESCRIPTION OF THE INVENTIONS

Figure 1A:
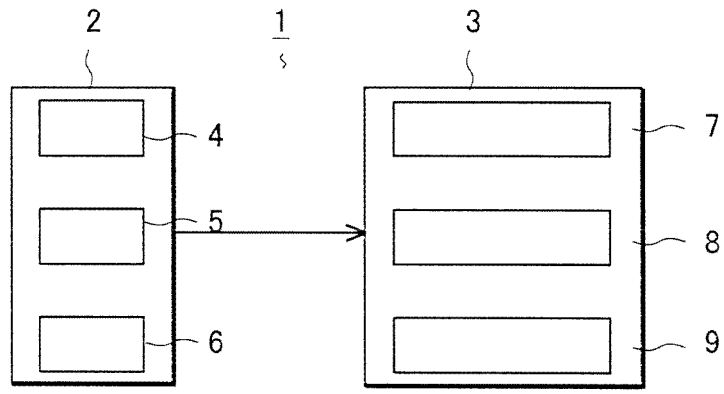
FIG. 1A is a block diagram, as well as FIGS. 1B and 1C are schematic diagrams, for explaining a laser marking machine used in a laser processing method in a preferred embodiment of the present invention.
Figure 1B:
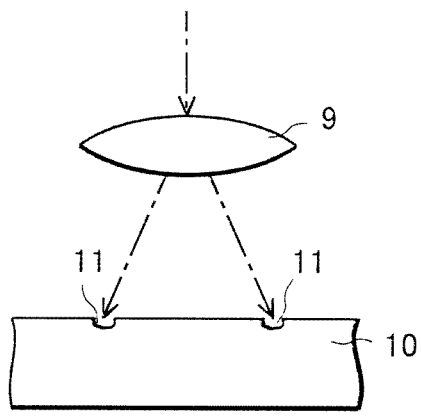
Figure 1C:
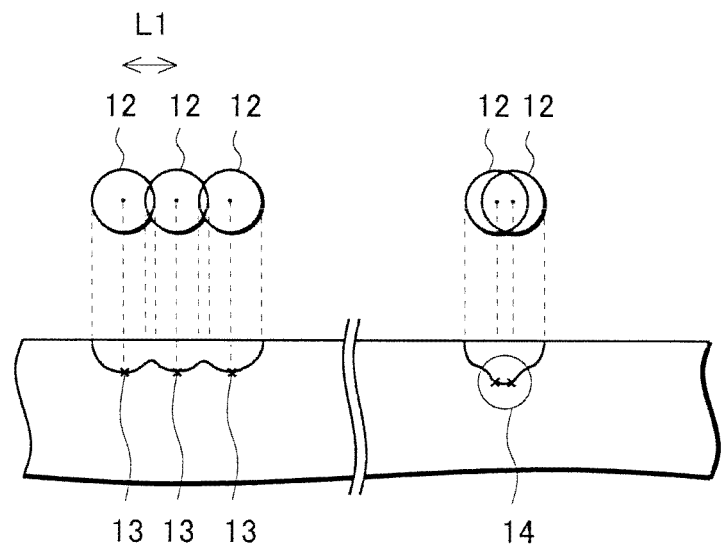

Hereinafter, description will be given of a laser processing method of a first embodiment of the present invention. FIG. 1A is a block diagram for explaining a laser marking machine. FIGS. 1B and 1C are schematic views for explaining the laser marking machine. FIGS. 2A to 4B are schematic diagrams for explaining the laser processing method.

As shown in FIG. 1A, a laser marking machine 1 marks a surface of a processing target with a letter, symbol, graphic or the like using a laser beam radiated from the carbon dioxide laser or YAG laser. Examples of the processing target include a resin package, a metal and the like. The laser marking machine 1 mainly includes a controller unit 2 and a laser head unit 3. Further, the controller unit 2 mainly includes an input part 4, a control part 5, and a memory part 6.

First, the input part 4 is a mechanism for an operator to input marking data and the like. Examples of the input part 4 include a touchscreen and a key input device. Incidentally, the input part 4 may be a personal computer. Utilizing the aforementioned touchscreen or the like, the operator inputs data needed for the marking into the controller unit 2. The data includes letters and figures such as a product number to be marked, the size of the letters to be marked, the laser marking speed, the spot width of a marking laser, and the marking start and end points.

Next, the control part 5 includes, for example, a CPU, a memory and the like, as well as controls the operation of each of the units constituting the laser marking machine 1. Specifically, the control part 5 performs various arithmetic processes on input data, such as a letter to be marked, which is inputted from the input part 4, and thus controls the laser head unit 3 according to the result of the arithmetic processes.

Next, the memory part 6 has a region of non-volatile memory such as a flash memory, SRAM (Static Random Access Memory) and ROM (Read-only Memory), and a region of volatile memory such as a DRAM (Dynamic Random Access Memory). The region of the non-volatile memory stores marking data on the types, sizes, processing lines and the like of basic letters, basic symbols and the like which are capable of being marked. Meanwhile, the region of the volatile memory temporarily stores marking data on processing lines, marking start points, marking end points, spot widths and the like of letters, symbols and the like to be actually marked.

Next, the laser head unit 3 includes, for example, a laser oscillator 7, a laser polarizer 8, an fθ lens 9 and so forth. The laser oscillator 7 is a mechanism for radiating a laser beam, is controlled by an oscillation signal from the control part 5, and repeats an on-operation and an off-operation at predetermined timings. The laser beam radiated from the laser oscillator 7 enters a beam expander via a shutter, an output reflective mirror, an optical-axis adjusting mirror and the like, as well as is thus converted into a parallel beam. Next, the laser beam emitted from the beam expander is sequentially reflected by an X-axis galvano-mirror and a Y-axis galvano-mirror, as well as subsequently enters the fθ lens. In other words, the control part 5 controls the laser oscillator 7, the X-axis and Y-axis galvano-mirrors, and the like so as to move the spot of the laser beam on a laser processing line. The laser oscillator 7 is turned on and off appropriately in accordance with the movement.

As shown in FIG. 1B, the laser beam entered the fθ lens is converged by the fθ lens, and is radiated as a spot beam onto a surface of a processing target 10. The temperature of the surface of the processing target 10 rapidly rises upon the radiation of the laser beam, and the surface is melted and then vaporized. Thereby, a recessed portion 11 is formed on the surface. By the combination of such recessed portions 11, a letter, graphic or the like is marked in the surface of the processing target 10.

As shown in FIG. 1C, the energy of each spot 12 of the laser beam becomes stronger toward the center of the spot 12, and a corresponding recessed portion 11 is accordingly engraved more deeply toward the center thereof. Meanwhile, the energy of each spot 12 thereof becomes weaker toward the peripheral portion of the spot 12, and the corresponding recessed portion 11 is accordingly engraved more shallowly toward the peripheral portion thereof. In the laser processing method described hereinbelow, as shown in the left half of the drawing, spots 12 are set up in a way that their peripheral portions overlap each other, and the engraving depths of the recessed portions 11 are thereby made to become almost uniform. Cross signs 13 indicate the engraving depths of the recessed portions 11 at the central portions of the corresponding spots 12. The distance between each two adjacent laser processing lines is set up so that, even in a region where the spots 12 overlap each other, the region should not be engraved deeper than indicated by the cross sign 13. To this end, a separation distance L1 between the centers of each two adjacent laser processing lines is set slightly less than the spot width of the laser beam.

On the other hand, as shown in the right half of the drawing, when two adjacent spots 12 of the respective laser beams overlap each other in a way that their central portions are located very close to each other, or when the central portions of the respective two adjacent spots 12 intersect each other, a region engraved more deeply than indicated by the cross signs 13 (the left half of the drawing) is formed as indicated by a circle 14. In this case, the processing target 10 is engraved too much. This causes problems such as a problem that the uniformity of the engraving depths is not sustained, the recognition accuracy is deteriorated, and the moisture resistance of the processing target 10 is deteriorated. When the processing target 10 is a thin package of a semiconductor device, the package thickness is not secured above a thin metal wire thereof in the over-engraved region, and the package is treated as a defective product.

Hence, in the laser processing method described hereinbelow, laser processing lines (scanning lines) are set up with consideration given to an engraved amount in the aforementioned regions where the adjacent spots 12 overlap each other lest the laser processing lines (scanning lines) should intersect each other and should be arranged too closely. The processing lines are arranged along the outer border of a marked letter or the like. However, the processing lines only need to be arranged in such a manner that the engraved amount in the overlapping region is smaller than the engraved amount at the center of the spot as described above. The processing lines do not always have to be arranged parallel to each other.

Figure 2A:
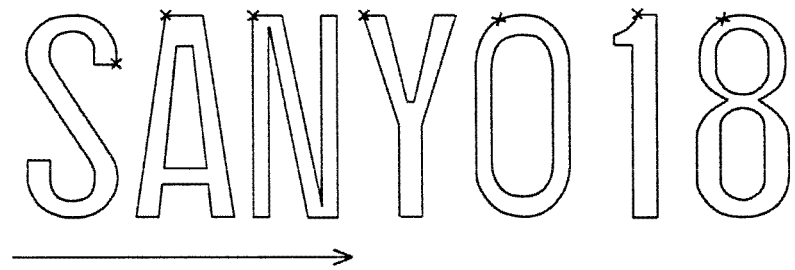
FIGS. 2A to 2C are schematic diagrams for explaining the laser processing method in the preferred embodiment of the present invention.

Description will be given of the laser processing method in which, as shown in FIG. 2A, a surface of a resin package is marked with, for example, "SANYO18" which is a combination of English letters and figures, by use of a laser marking machine 1. First of all, as described above, using an input part 4 such as a touchscreen, the operator inputs into a controller unit 2 "SANYO18" and necessary data on the size of letters to be marked, the interval between the marked letters, the laser marking speed, the spot width of a laser, the marking start point and end point, and the like. Next, marking a surface of a processing target 10 begins with the English letter "S," which is located in the leftmost portion of the drawing, with a laser oscillator 7, X-axis and Y-axis galvano-mirrors, and the like controlled by a control part 5 in accordance with the input data. The marking is performed sequentially from the leftmost portion of the drawing to the rightmost portion thereof. Finally, a number "8" located on the rightmost portion of the drawing is marked. Although described in detail later, as indicated by a cross sign on an upper portion of each of the English letters and figures to be marked, the marking begins at an upper portion of a border of each of the English letters and figures to be marked. Thereby, the distance that a laser unit 3 moves between the letters to be marked is made shorter, and the shortening of time needed for the laser marking is achieved.

Next, referring to FIGS. 2B and 2C, description will be given of the laser processing method in which, for example, an English letter "A" is marked.

Figure 2B:
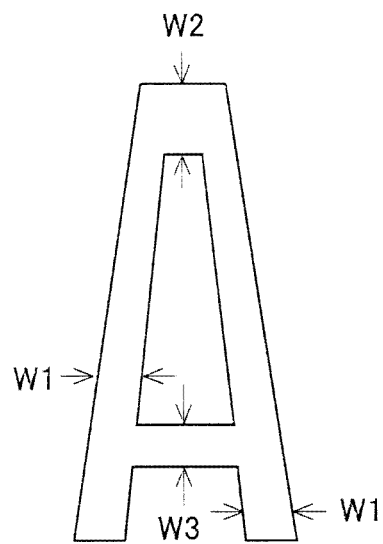

First, as shown in FIG. 2B, English letters, figures, graphics and the like used in a product number, product name, company logo and the like to be marked on a resin package or the like are often designed in shapes which make the company and product names instantly recognizable. In addition, even if figures and English letters used in a product number are not designed, for example, some figures often have several line widths, for example, for the purpose of clearly distinguishing the figure "0" from the English letter "O." Hence, it is difficult to mark a product number, product name, company logo and the like, which have multiple line widths, by a single laser processing using a unicursal approach in a uniform spot width.

Specifically, the English letter "A" substantially has three line widths. Each inclined region in an "inverted V" portion of the English letter "A" has a line width W1. An upper "−" portion in a lateral direction of the drawing has a line width W2. A lower "−" portion in the lateral direction of the drawing has a line width W3. The relationship among the line widths is expressed with W3<W1<W2. For this reason, if a laser processing is performed in the unicursal approach multiple times in accordance with the region of the line width W2, the laser processing is performed in an overlapping manner somewhere in the other regions of the line widths W1 and W3, and consequently, the processing depth becomes deeper. Incidentally, the line widths W1 and W3 are line widths substantially equal to each other, or the line width W1 is slightly wider than the line width W3. In the following description, let us assume that the line widths W1 and W3 are widths each laser-processed with three spot widths, while the line width W2 is a width laser-processed with five spot widths.

Figure 2C:
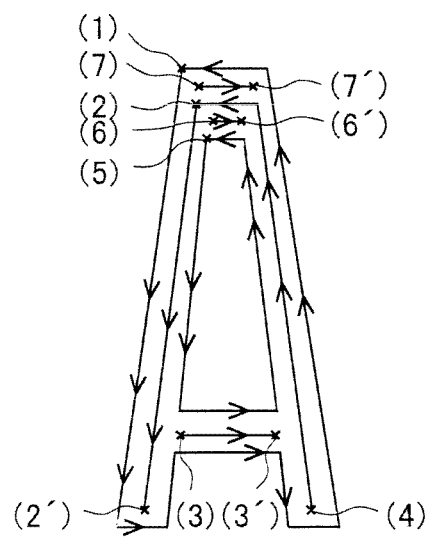

Thus, as shown in FIG. 2C, the laser beam spot radiated from the laser head unit 3 is set up at a position indicated by a cross sign (1) on an outer border of the English letter "A." Then, the laser oscillator 7 is turned on, and a laser processing is performed along a processing line set up on the outer border of the English letter "A." In this event, the laser processing is performed in the unicursal approach on a continuous line. The laser processing makes a circuit counterclockwise, starting at the position indicated by the cross sign (1). When the spot returns to the position indicated by the cross sign (1), the laser oscillator 7 is turned off, and the first laser processing is ended.

Subsequently, while the laser oscillator 7 is turned off, the spot is set up at a position indicated by a cross sign (2) for a second laser processing line by moving it from the position indicated by the cross sign (1) on the first laser processing line. Then, the laser oscillator 7 is turned on, and a laser processing is performed in one inclined region in the "inverted V" portion of the English letter "A" on the left side of the drawing. When the spot reaches a position indicated by a cross sign (2'), the laser oscillator 7 is turned off, and the second laser processing is ended.

Subsequently, while the laser oscillator 7 is turned off, the spot is set up at a position indicated by a cross sign (3) for a third laser processing line by moving it from the position indicated by the cross sign (2') on the second laser processing line. Then, the laser oscillator 7 is turned on, and a laser processing is performed in a region of the lower "−" portion of the English letter "A" in the lateral direction of the drawing. When the spot reaches a position indicated by a cross sign (3'), the laser oscillator 7 is turned off, and the third laser processing is ended Afterward, while the laser oscillator 7 is turned off, the spot is set up at a position indicated by a cross sign (4) for a fourth laser processing line by moving it from the position indicated by the cross sign (3') on the third laser processing line. Then, the laser oscillator 7 is turned on, and a laser processing is performed in the other inclined region in the "inverted V" portion of the English letter "A" on the right side of the drawing and in a region of the upper "−" portion of the English letter "A" in the lateral direction of the drawing. When the spot reaches the position indicated by the cross sign (2), the laser oscillator 7 is turned off, and the fourth laser processing is ended.

Thereafter, while the laser oscillator 7 is turned off, the spot is set up at a position indicated by a cross sign (5) for a fifth laser processing line by moving it from the position indicated by the cross sign (2) on the fourth laser processing line. Then, the laser oscillator 7 is turned on, and a laser processing is performed along an inner border of the English letter "A." In this event, the laser processing is performed in the unicursal approach on a continuous line. When the spot returns to the position indicated by the cross sign (5), the laser oscillator 7 is turned off, and the fifth laser processing is ended.

Subsequently, while the laser oscillator 7 is turned off, the spot is set up at a position indicated by a cross sign (6) for a 6th laser processing line by moving it from the position indicated by the cross sign (5) on the fifth laser processing line. Then, the laser oscillator 7 is turned on, and a laser processing is performed in one region in the upper "–" portion of the English letter "A" in the lateral direction of the drawing.

When the spot reaches a position indicated by a cross sign (6'), the laser oscillator 7 is turned off, and the 6th laser processing is ended.

Afterward, while the laser oscillator 7 is turned off, the spot is set up at a position indicated by a cross sign (7) for a 7th laser processing line by moving it from a position indicated by the cross sign (6') on the 6th laser processing line. Then, the laser oscillator 7 is turned on, and a laser processing is performed in the other region in the upper "–" portion of the English letter "A" in the lateral direction of the drawing. When the spot reaches a position indicated by a cross sign (7'), the laser oscillator 7 is turned off, and the 7th laser processing is ended. With this, the laser processings for the entire region of the English letter "A" are completed.

As described above, the laser processings are performed in a longitudinal direction of the processing region along the border of the English letter "A," but not in the directions of the widths W1 to W3 of the laser processing region. Unlike the conventional laser processing method, this laser processing method repeats no laser processing in the line width W1 multiple times, and accordingly reduces the number of laser processing lines (scanning lines) to a large extent. Moreover, this laser processing method shortens the time needed for the marking to a large extent, and the laser marking workability is greatly improved. Note that the 6th and 7th laser processings for the interspaces are performed along the border and in the longitudinal direction of the processing region as well.

A spot movement during each non-marking period between the laser processing lines is set up in a way that makes the distance of the movement the shortest. For example, the spot movement from the cross sign (2') is made toward the cross sign (3) but not to the cross sign (4), and the spot movement from the cross sign (5) is made toward the cross sign (6) but not to the cross sign (7). This spot moving method makes the movement distance during each non-marking period shorter than ever, and achieves the shortening of the time needed to mark one letter as a whole.

Next, using FIGS. 3A and 3B, description will be given of the laser processing method in which, for example, a figure "8" is marked.

Figure 3A:
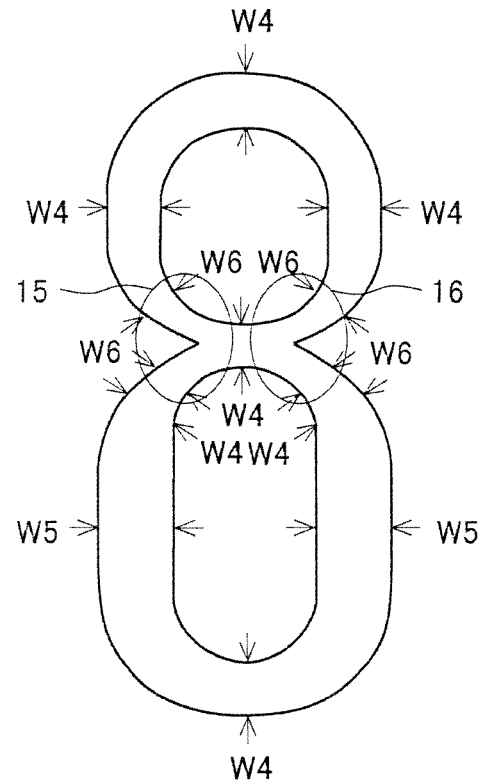
FIGS. 3A and 3B are other schematic diagrams for explaining the laser processing method in the preferred embodiment of the present invention.

As shown in FIG. 3A, the figure "8" has three line widths. A "0" portion of the figure "8" on an upper side of the drawing mainly has a line width W4, and the other "0" portion of the figure "8" on a lower side of the drawing has line widths W4 and W5. Parts of the intersection region between the "0" portions on the upper and lower sides of the drawing, which are indicated by circles 15, 16, have a line width W6. The relationship among the line widths is W6<W4<W5. In the following description, let us assume that the line width W4 is a width laser-processed with three spot widths, the line width W5 is a width laser-processed with four spot widths, and the line width W6 is a width laser-processed with two spot widths.

Figure 3B:
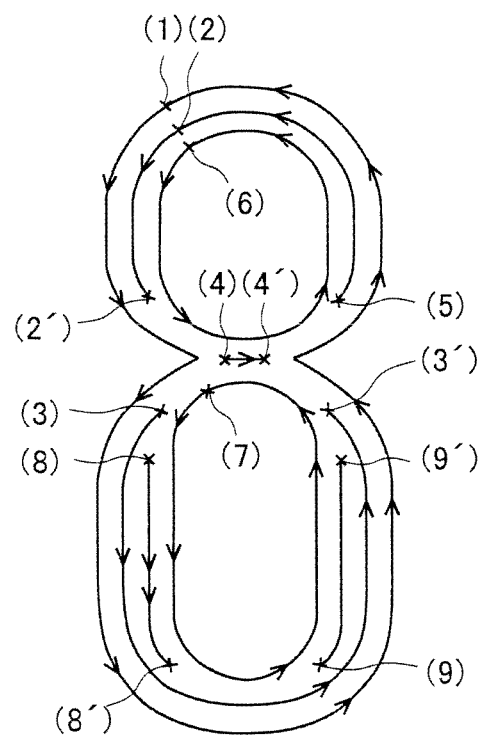

As shown in FIG. 3B, a spot is set up at a position indicated by a cross sign (1) on an outer border of the figure "8." Then, the laser oscillator 7 is turned on, and a laser processing is performed along a processing line set up on the outer border of the figure "8." In this event, the laser processing is performed in the unicursal approach on a continuous line. The laser processing makes a circuit counterclockwise, starting at the position indicated by the cross sign (1). When the spot returns to the position indicated by the cross sign (1), the laser oscillator 7 is turned off, and the first laser processing is ended.

Subsequently, while the laser oscillator 7 is turned off, the spot is set up at a position indicated by a cross sign (2) for a second laser processing line by moving it from the position indicated by the cross sign (1) on the first laser processing line. Then, the laser oscillator 7 is turned on, and a laser processing is performed in one "0" portion of the figure "8" on the upper side of the drawing. When the spot reaches a position indicated by a cross sign (2'), the laser oscillator 7 is turned off, and the second laser processing is ended. This is because the line width W6 in the regions indicated by the circles 15, 16 (see FIG. 3A) is narrower as illustrated, and the two laser processings respectively for the outer border and an inner border of the number "8" are sufficient for the regions.

Thereafter, while the laser oscillator 7 is turned off, the spot is set up at a position indicated by a cross sign (3) for a third laser processing line by moving it from the position indicated by the cross sign (2') on the second laser processing line. Then, the laser oscillator 7 is turned on, and a laser processing is performed in the other "0" portion of the figure "8" on the lower side of the drawing. When the spot reaches a position indicated by a cross sign (3'), the laser oscillator 7 is turned off, and the third laser processing is ended.

Afterward, while the laser oscillator 7 is turned off, the spot is set up at a position indicated by a cross sign (4) for a fourth laser processing line by moving it from the position indicated by the cross sign (3') on the third laser processing line. Then, the laser oscillator 7 is turned on, and a laser processing is performed in the intersection region between the two "0" portions of the figure "8" on the upper and lower sides of the drawing. When the spot reaches a position indicated by a cross sign (4'), the laser oscillator 7 is turned off, and the fourth laser processing is ended.

Subsequently, while the laser oscillator 7 is turned off, the spot is set up at a position indicated by a cross sign (5) for a fifth laser processing line by moving it from the position indicated by the cross sign (4') on the fourth laser processing line. Then, the laser oscillator 7 is turned on, and a laser processing is performed in the "0" portion of the figure "8" on the upper side of the drawing. When the spot reaches the position indicated by the cross sign (2), the laser oscillator 7 is turned off, and the fifth laser processing is ended.

Thereafter, while the laser oscillator 7 is turned off, the spot is set up at a position indicated by a cross sign (6) for a 6th laser processing line by moving it from the position indicated by the cross sign (2) on the fifth laser processing line. Then, the laser oscillator 7 is turned on, and a laser processing is performed along inner border of the "0" portion of the figure "8" on the upper side of the drawing. In this event, the laser processing is performed in the unicursal approach on a continuous line. When the spot returns to the position indicated by the cross sign (6), the laser oscillator 7 is turned off, and the 6th laser processing is ended.

Afterward, while the laser oscillator 7 is turned off, the spot is set up at a position indicated by a cross sign (7) for a 7th laser processing line by moving it from the position indicated by the cross sign (6) on the 6th laser processing line. Then, the laser oscillator 7 is turned on, and a laser processing is performed along the inner border of the "0" portion of the figure "8" on the lower side of the drawing. When the spot returns to the position indicated by the cross sign (7), the laser oscillator 7 is turned off, and the 7th laser processing is ended.

Subsequently, while the laser oscillator 7 is turned off, the spot is set up at a position indicated by a cross sign (8) for an 8th laser processing line by moving it from the position indicated by the cross sign (7) on the 7th laser processing line. Then, the laser oscillator 7 is turned on, and a laser processing is performed in the "0" portion of the figure "8" on the lower side of the drawing. When the spot reaches a position indicated by a cross sign (8'), the laser oscillator 7 is turned off, and the 8th laser processing is ended.

Thereafter, while the laser oscillator 7 is turned off, the spot is set up at a position indicated by a cross sign (9) for a 9th laser processing line by moving it from the position indicated by the cross sign (8') on the 8th laser processing line. Then, the laser oscillator 7 is turned on, and a laser processing is performed in the "0" portion of the figure "8" on the lower side of the drawing. When the spot reaches a position indicated by a cross sign (9'), the laser oscillator 7 is turned off, and the 9th laser processing is ended. With this, the laser processings for the entire region of the figure "8" are completed.

As described above, the line width W6 is the narrowest in the regions indicated by the circles 15, 16. For this reason, the spot is moved utilizing the non-marking state (off-operation) depending on the necessity. Moreover, in the regions where the laser processing lines intersect each other, and in the regions where the line width is narrower, portions on which the respective laser processings are performed by the center region of the spot are prevented from intersecting each other, and the surface of the processing target is prevented from being engraved deeply.

Further, since the first laser processing is performed along the outer border of the figure "8," the border of the marked letter is smoothly shaped, and the visibility of the marked letter is improved. Particularly, when the border of a letter to be marked has a curved line like the figure "8," the appearance is favorably formed. Additionally, when the marked letter or the like is used for pattern recognition, the recognition accuracy is also improved because of the favorable appearance.

Furthermore, as in the case of the English letter "A," the laser processing lines are set up in a longitudinal direction along the border, but not in the directions of the widths W4 to W6. Accordingly, the number of laser processing lines (scanning lines) is greatly reduced, the time needed for the marking is also greatly shortened, and the laser marking workability is greatly improved.

Moreover, a spot movement during each non-marking period between the laser processing lines is set up in a way that makes the distance of the movement the shortest. This makes the movement distance during each non-marking period shorter than ever, and achieves the shortening of the time needed to mark one letter as a whole.

Figure 4A:
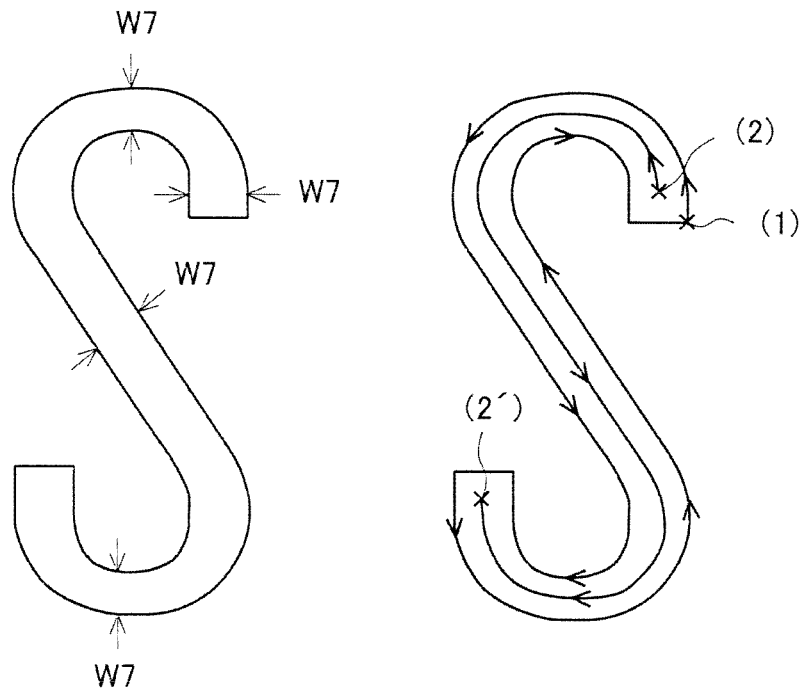
FIGS. 4A and 4B are the other schematic diagrams for explaining the laser processing method in the preferred embodiment of the present invention.

Next, using FIG. 4A, description will be given of the laser processing method in which, for example, an English letter "S" is marked.

As illustrated, the English letter "S" has one line width which is denoted by a reference sign W7. In addition, the line width W7 is a width laser-processed with three spot widths.

To begin with, a spot is set up at a position indicated by a cross sign (1) on an outer border of the English letter "S." Then, the laser oscillator 7 is turned on, and a laser processing is performed along a processing line set up on the outer border of the English letter "S." In this event, the laser processing is performed in the unicursal approach on a continuous line. The laser processing makes a circuit counterclockwise, starting at the position indicated by the cross sign (1). When the spot returns to the position indicated by the cross sign (1), the laser oscillator 7 is turned off, and the first laser processing is ended.

Subsequently, while the laser oscillator 7 is turned off, the spot is moved to a position indicated by a cross sign (2) for a second laser processing line from the position indicated by the cross sign (1) on the first laser processing line. Then, the laser oscillator 7 is turned on, and the spot is moved in accordance with the shape of the English letter "S" (along the external border thereof). When the spot reaches a cross sign (2'), the laser oscillator 7 is turned off, and the second laser processing is ended. Thus, the laser processings for the entire region of the English letter "S" is ended. Note that a similar laser processing method is also carried out for other English letters such as "C," "I," "J," "L" and "U."

In English letters and the like each having the single line width which is denoted by reference sign W7, as described above, the laser processing lines are set up in a longitudinal direction along the border, but not in the widthwise direction. Accordingly, the number of laser processing lines (scanning lines) is greatly reduced, the time needed for the marking is also greatly shortened, and the laser marking workability is greatly improved.

A spot movement between each two successive laser processing lines is set up, for example, in a way that makes the distance of the movement less than the diameter of the spot, and makes the distance thereof the shortest. This makes the movement distance during each non-marking period shorter than ever, and achieves the shortening of the time needed to mark one letter as a whole.

Figure 4B:
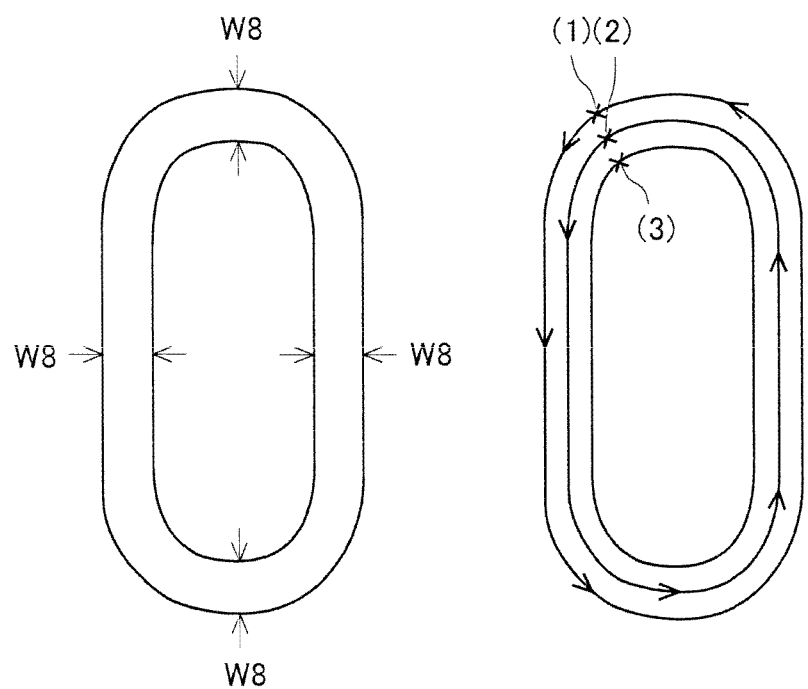

Next, using FIG. 4B, description will be given of the laser processing method in which, for example, an English letter "O" is marked.

To begin with, a spot is set up at a position indicated by a cross sign (1) on an outer border of the English letter "O." Then, the laser oscillator 7 is turned on, and a laser processing is performed along a processing line set up on the outer border of the English letter "O." In this event, the laser processing is performed in the unicursal approach on a continuous line. The laser processing makes a circuit counterclockwise, starting at the position indicated by the cross sign (1). When the spot returns to the position indicated by the cross sign (1), the laser oscillator 7 is turned off, and the first laser processing is ended.

Subsequently, while the laser oscillator 7 is turned off, the spot is moved to a position indicated by a cross sign (2) for a second laser processing line from the position indicated by the cross sign (1) on the first laser processing line. Then, the laser oscillator 7 is turned on, and a laser processing is performed along the outer border of the English letter "O" in the unicursal approach on a continuous line. When the spot returns to the position indicated by the cross sign (2), the laser oscillator 7 is turned off, and the second laser processing is ended.

Finally, while the laser oscillator 7 is turned off, the spot is moved to a position indicated by a cross sign (3) for a third laser processing line from the position indicated by the cross sign (2) on the second laser processing line. Then, the laser oscillator 7 is turned on, and a laser processing is performed along the inner border of the English letter "O" in the unicursal approach in a continuous line. With this, the laser processings for the entire region of the English letter "O" are completed. Note that a similar laser processing method is also carried out for the figure "0" and something similar.

When, as in the case of the English letter "O," the marking is performed with the single line width, which is denoted by reference sign W8, by three laser processings each in the unicursal approach along the border of the letter as described above, the laser processing lines are also set up in a longitudinal direction along the border, but not in the widthwise directions. Accordingly, the number of laser processing lines (scanning lines) is greatly reduced, the time needed for the marking is also greatly shortened, and the laser marking workability is greatly improved.

In addition, a spot movement between each two successive laser processing lines is set up, for example, in a way that makes the distance of the movement less than the diameter of the spot, and makes the distance thereof the shortest. This makes the movement distance during each non-marking period shorter than ever, and achieves the shortening of the time needed to mark one letter as a whole.

It should be noted that, although this embodiment has been described as the cases where the surface of the processing target 10 is marked with the English letters and figures by the laser processings, the embodiment is not limited to this case. When, for example, a katakana letter (a Japanese syllabary letter), a Roman letter, graphic or the like is marked on a surface of a processing target 10 by laser processing, similar effects can be obtained by setting up laser processing lines along its border and in a longitudinal direction of its processing region as described above. Besides, various modifications can be made without departing from the gist of the present invention.

Figure 5:
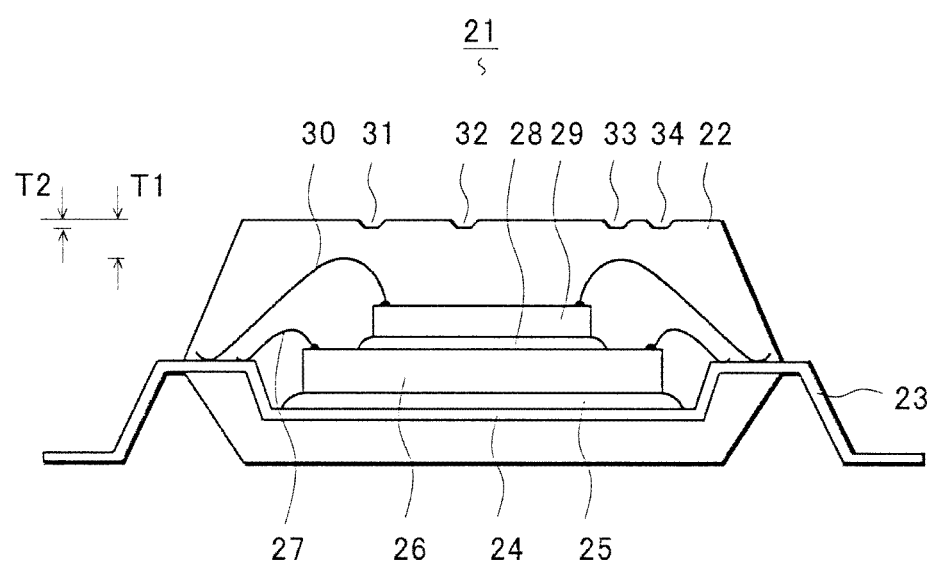
FIG. 5 is a cross-sectional view for explaining a semiconductor device in another preferred embodiment of the present invention.
Figure 6A:
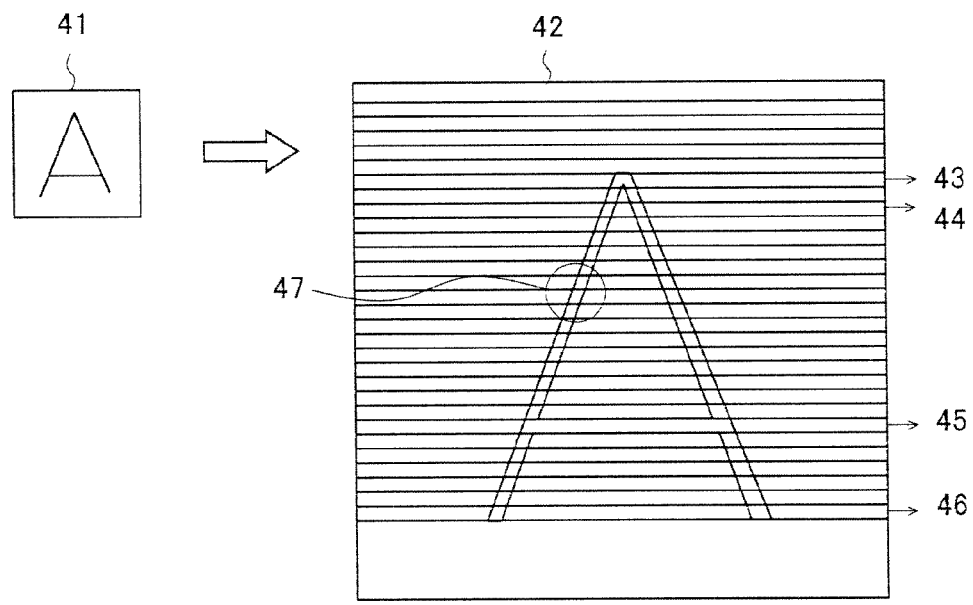
FIGS. 6A to 6C are schematic views for explaining a laser processing method in a conventional embodiment.
Figure 6B:
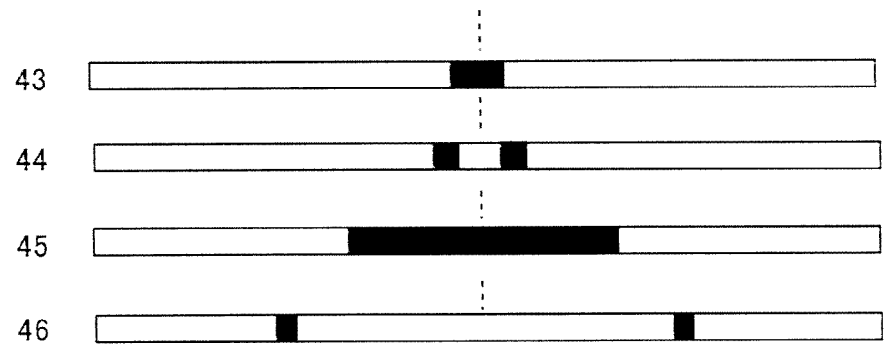
Figure 6C:
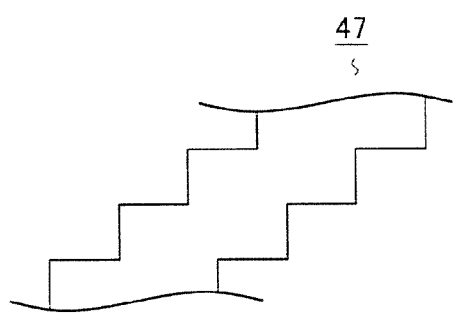

Next, description will be given of a semiconductor device of a second embodiment of the present invention, which is configured to performing the marking using the laser processing method of the first embodiment. FIG. 5 is a cross-sectional view for explaining the semiconductor device.

As shown in FIG. 5, multiple leads 23 extend from side surfaces of a resin package 22 of a semiconductor device 21. The extending leads 22 are bent in the shape of a gull wing. A semiconductor element 26 is fixedly bonded to an upper surface of an island 24 in the resin package 22 using a conductive adhesive 25 such as Ag paste and solder. Multiple electrode pads (not illustrated) are formed on an upper surface of the semiconductor element 26. The electrode pads and the leads 23 are connected together with thin metal wires 27. A semiconductor element 29 is fixedly bonded to the upper surface of the semiconductor element 26 using an insulating adhesive 28 such as an epoxy resin. Similarly, electrode pads (not illustrated) on the semiconductor element 29 and the leads 23 are connected together with thin metal wires 30. Note that a gold wire or a copper wire is used as the thin metal wires 27, 30.

As illustrated, a product number, a product name, a company logo or the like is laser-marked on a top surface of the resin package 22. Recessed portions 31, 32, 33, 34 are formed in the marking region.

When some thin metal wires 30 are exposed to the outside from the resin package 22 or when the resin thickness is so small that some thin metal wires 30 can be seen through the resin package 22, a semiconductor device including such a resin package is treated as a defective product because there is a problem of electrical short circuit. Hence, to deal with the aforementioned short circuit problem in the resin package 22, a thickness T1 from top portions of the thin metal wires 30 to the upper surface of the resin package 22 is designed in consideration of an assembling error which may occur in the package and the like. For example, the thickness error of each of the conductive adhesive 25 and the insulating adhesive 28 is 5 μm. The thicknesses of the semiconductor elements 26, 29 are 20 μm. In this structure, 50 μm is considered as the assembling error. Meanwhile, a single laser processing engraves the recessed portions 31 to 34 in a depth of 10 to 15 μm from the upper surface of the resin package 22. Accordingly, an engraving depth T2 is considered as being 15 μm. As a result, the thickness T1 from the top portions of the thin metal wires 30 to the upper surface of the resin package 22 is designed to be 65 μm.

Moreover, as described above in FIG. 1C, when the engraving depth T2 of the recessed portions 31 to 34 is deeper due to the laser processing lines intersecting each other or the spot centers locating very close to each other, the engraving depth T2 has to be considered as being 30 μm. As a result, the thickness T1 from the top portions of the thin metal wires 30 to the upper surface of the resin package 22 becomes larger. This leads to a structure having difficulty in satisfying a demand that the resin package 22 be made thinner.

In other words, the semiconductor device 21 achieves a structure capable of satisfying the demand that the resin package 22 be made thinner by using the laser processing method, which has been described using FIGS. 1A to 4B, and in which the single laser processing limits the engraving depth T2 of the recessed portions 31 to 34 to 10 to 15 μm. Moreover, the use of the aforementioned laser processing method improves the visibility of the marked letters or the like.

It should be noted that, although the semiconductor device 21 of this embodiment has been described as having the structure in which the two semiconductor elements 26, 29 are stacked and are covered with the resin package 22, the semiconductor element 21 is not limited to this case. For example, even a structure having no semiconductor element stacked, a structure having three or more semiconductor elements stacked, a package made of a ceramic, and a package made of plastic offers similar effects such as thinner package fabrication, when the aforementioned laser processing method is used for them. Besides, various modifications can be made without departing from the gist of the present invention.

The preferred embodiments of the present invention reduce the number of laser processing lines, shorten the time needed for the marking, and improve the laser marking workability, because the laser processing lines are set up along the outer border of a letter or figure to be marked and in a longitudinal direction of a marking region.

In addition, the preferred embodiments of the present invention reduce the distance of the movement of the laser head during a non-marking period between each two successive laser processings, and shorten the time needed for the marking.

Moreover, the preferred embodiments of the present invention prevent the over-engraving of a processing target, and improve the quality of the processing target, because the laser processing lines do not intersect each other.

Further, the preferred embodiments of the present invention reduce the distance of the movement of the laser head to a great extent, and also shorten the time needed for the marking to a great extent, for letters and the like which have one line width as in the case of the English letter "O."

Additionally, the preferred embodiments of the present invention give a smooth shape to the border of each of letters and the like to be marked, and improve the visibility of the marked letter or the like, because the laser processing in the unicursal approach is performed along the outer border of the marked letter or the like.

Furthermore, the preferred embodiments of the present invention prevent the over-engraving of the package, and realize the thinning of the package, because the package surface is marked by the aforementioned laser processing method.

What is claimed is:

1. A laser processing method for marking a processing target with at least one of a letter and a figure, the at least one of a letter and a figure being characterized by a processing region having an outer border, the method comprising steps of:

setting a plurality of processing lines in the processing region of the letter or figure to be marked; and delivering a laser beam to the processing target to mark the processing target along each of the plurality of processing lines, wherein a first processing line is set along the outer border of the processing region, and each subsequent processing line is set along a longitudinal direction of the processing region, after the laser beam is delivered along the first processing line set along the outer border of the processing region, the laser beam is delivered along a subsequent processing line set inside the outer border of the processing region, when the laser beam is delivered to the processing target, a laser spot is formed on the processing target along each processing line, a center of the laser spot having energy stronger than a periphery of the laser spot, the center of the laser spot engraving the processing target deeper than the periphery of the laser spot, and the adjacent processing lines are arranged so that a region of the processing target which is engraved by two overlapping laser spots on the respective adjacent processing lines has a depth less than that created by the center of the laser spot.

2. The laser processing method according to claim 1, wherein:

the letter or figure to be marked has a plurality of line widths, the plurality of processing lines are set in the processing region, and the processing lines do not intersect each other.

3. The laser processing method according to claim 1, wherein the letter or figure to be marked has a single line width, the plurality of processing lines are set to cover the entire processing region of the letter or figure, and the processing lines are ordered, and a distance between an end of one processing line and a beginning of a successive processing line is shorter than a spot diameter of the laser beam.

4. The laser processing method according to claim 1, wherein delivering the laser beam along the first processing line on the outer border is performed in a unicursal approach.

5. The laser processing method according to claim 2, wherein delivering the laser beam along the first processing line on the outer border is performed in a unicursal approach.

6. The laser processing method according to claim 3, wherein delivering the laser beam along the first processing line on the outer border is performed in a unicursal approach.

7. A semiconductor device in which a surface of a package is marked by the laser processing method according to claim 1.

8. A semiconductor device in which a surface of a package is marked by the laser processing method according to claim 2.

9. A semiconductor device in which a surface of a package is marked by the laser processing method according to claim 3.

10. A semiconductor device in which a surface of a package is marked by the laser processing method according to claim 4.

* * * * *